United States Patent [19]

Chou et al.

[11] Patent Number: 5,660,957
[45] Date of Patent: Aug. 26, 1997

[54] ELECTRON-BEAM TREATMENT PROCEDURE FOR PATTERNED MASK LAYERS

[75] Inventors: William T. Chou, Cupertino; Solomon I. Beilin, San Carlos; David Kudzuma, San Jose; Wen-chou Vincent Wang, Cupertino, all of Calif.

[73] Assignee: Fujitsu Limited, Japan

[21] Appl. No.: 649,999

[22] Filed: May 16, 1996

[51] Int. Cl.$^6$ ........................................ G03F 9/00
[52] U.S. Cl. .................. 430/5; 430/296; 430/311; 250/492.3
[58] Field of Search ................... 430/5, 296, 311; 250/492.3; 264/424

[56] References Cited

U.S. PATENT DOCUMENTS

| | | | |
|---|---|---|---|
| 3,627,599 | 12/1971 | Goldmacher et al. | 156/13 |
| 4,090,936 | 5/1978 | Barton | 204/159.18 |
| 4,264,711 | 4/1981 | Greeneich | 430/296 |
| 4,312,935 | 1/1982 | Engler et al. | 430/296 |
| 4,339,526 | 7/1982 | Baise et al. | 430/296 |
| 4,410,611 | 10/1983 | MacIver | 430/5 |
| 4,474,869 | 10/1984 | Brault et al. | 430/296 |
| 4,702,993 | 10/1987 | White et al. | 430/296 |
| 4,876,177 | 10/1989 | Akahoshi et al. | 430/313 |
| 4,968,552 | 11/1990 | Linde | 428/195 |
| 5,024,918 | 6/1991 | Porter et al. | 430/269 |
| 5,064,748 | 11/1991 | Bobbio | 430/311 |
| 5,153,103 | 10/1992 | Kotachi et al. | 430/296 |
| 5,252,430 | 10/1993 | Hashimoto et al. | 430/296 |

FOREIGN PATENT DOCUMENTS 4-23425-A  1/1992  Japan .......................... H01L 21/027

OTHER PUBLICATIONS

W.R.. Livesay, "A New Compact Electron Beam Curing System," Radtech 1990—North American Conference, Chicago, IL, Mar. 25–29, 1990, pp. 1–6.

W.R. Livesay, "Large Area Electron Beam Source," Electron Vision Corporation, San Diego, CA, Jun. 1–4, 1993, pp. 1–9.

W.R. Livesay, et al., "Electron Beam Hardening of Photoresist," SPIE Microlithography 1993 Conference, 1993.

W.R. Livesay, "Vertical Lithography—Controlling Resist Profiles in Optical Lithography With a Large Area Electron Beam," SPIE vol. 2194, pp. 355–365, Jan. 1994.

Matthew Ross, "Chemical Analysis of Electron Beam Curing of Positive Photoresist," SPIE vol. 2195, pp. 834–848, May, 1994.

*Primary Examiner*—S. Rosasco
*Attorney, Agent, or Firm*—Coudert Brothers

[57] ABSTRACT

Methods for pretreating patterned masks layers, such as photoresist masks, with electron-beam radiation for use in high temperature processes are disclosed. The electron-beam exposure deactivates compounds within the mask material which would ordinarily decompose and produce gasses within the photoresist layer. The gasses cause blistering in the untreated photoresist layer, which in turn degrades the dimensional integrity of the untreated layer.

10 Claims, 1 Drawing Sheet

1

ELECTRON-BEAM TREATMENT PROCEDURE FOR PATTERNED MASK LAYERS

FIELD OF THE INVENTION

The present invention relates to treating patterned photoresist layers and the like prior to exposure to high temperatures so as to improve the dimensional integrity and stability of the patterns in such layers. The invention may be applied to pre-treating photoresist etch masks used in plasma-assisted etching processes, such as for example, reactive ion etching (RIE). The present invention is particularly beneficial to thick photoresist layers, typically greater than 12 μm.

BACKGROUND OF THE INVENTION

Patterned photoresist layers are commonly used as masks in plasma-assisted etching processes, such as reactive ion etching (RIE). Plasma-assisted etching processes generally expose the photoresist to elevated temperatures which often causes out-gassing of trapped nitrogen from the photoresist and flowing of the photoresist material. For photoresists which have thicknesses of more than 12 μm, gas bubbles, blisters, and large changes in the patterned dimensions often occur, which detrimentally affect the ability of the photoresist to act as an effective etch mask. The detrimental effects often limit the smallest dimension that can be reliably reproduced in these etch processes.

One prior art approach to solving these problems has been to use metal as an etch mask, which is more stable since it does not contain nitrogen. The metal is deposited over the layer to be etched, and is then patterned by wet etching using a patterned photoresist mask. After the metal has been pattern etched, the photoresist is removed. A major drawback of this approach is that the pattern resolution in the metal mask cannot be any better than the resolution of the photoresist mask, and is often worse due to the isotropic characteristic of the wet etching process used to etch the metal mask.

These resolution problems can be addressed by patterning the metal layer with a metal lift-off process, whereby a photoresist layer is formed and patterned prior to depositing the metal layer. This photoresist layer is thicker than the metal layer, and has a pattern which is the negative, or compliment, of the desired pattern of the metal layer. The metal layer is then formed over the photoresist mask such that the metal layer has vertical discontinuities at the perimeters of the photoresist patterns. The discontinuities expose small portions of the photoresist so that a stripper can reach the photoresist and dissolve it. When the photoresist is exposed to the stripper and dissolves, the unwanted metal which forms the negative image of the desired metal pattern is lifted off and removed from the substrate. While this approach has improved resolution, it nonetheless entails additional steps over using a single photoresist mask, which increases the costs of manufacturing. Additionally, the metal layer has to be stripped after being used as a mask, which increases costs and may create compatibility problems between the metal etchant and the underlying substrate layers.

Accordingly, there is a need for an etch mask for plasma-assisted etching processes and other high-temperature processes which have high resolution capability, which do not substantially degrade under high-temperature processing conditions, and which do not substantially increase overall processing complexity.

SUMMARY OF THE INVENTION

The present invention encompasses methods of treating a patterned mask layer prior to being used in a subsequent high-temperature processing step. Broadly stated, the present invention comprises the step of exposing a patterned mask layer to electron-beam radiation prior to using the mask layer in a high-temperature processing step. A high-temperature process is one which raises the local temperature at the surface of the mask layer to a value which is substantially equal to or greater than the flow temperature of the mask material. Mask materials may comprise photoresist materials, which have typical flow temperatures of between 100° C. and 120° C. High temperature processes generally do not exceed 300° C., and plasma-assisted etching processes generally do not exceed 200° C.

The inventors have discovered that many of the photoactive compounds used in typical photosensitive materials decompose during high temperature processing and generate gasses which cause blisters and bubbles in the material layer, particularly of thick photoresists (>12 μm). The inventors have further discovered that treating the photosensitive material to electron-beam radiation prior to high-temperature processing deactivates the photo-active compounds in such a manner that, once deactivated, they do not produce significant amounts of gas upon heating. The inventors have also observed that, under high temperature processing conditions, the so-treated material flows to a much smaller degree than an untreated layer, thereby better maintaining the dimensional integrity and resolution of the pattern over that of an untreated photo-sensitive material.

Because the mask comprises patterned photo-sensitive material, the patterns therein may be made with the high resolution. With the electron-beam treatment, the mask according to the present invention is better able to maintain its dimensional stability and integrity. The electron-beam treatment can be accomplished with a blank flood electron-beam exposure, which is a relatively simple step that does not add a significant amount of complexity to the overall processing.

Masks according to the present invention may be used in many high-temperature processes, such as plasma-assisted etching and ion beam implantation. Plasma-assisted etching includes the processes of: sputter etching, ion beam milling, reactive ion etching (RIE) (which is also known as reactive sputter etching), and reactive ion beam etching.

In a preferred embodiment of the present invention, which is well-suited to treating thick photoresist mask layers (>12 μm), the mask layer is first exposed to a low-current density, low-energy electron beam under a vacuum for an initial period of time. The beam energy is then increased over time to a maximum value determined by the mask thickness, while maintaining the beam's current density below a limit level. The beam's current density is then increased above the limit level for a period of time.

Accordingly, it is an object of the present invention to provide a mask for use in high temperature processing procedures which has high pattern-resolution capability, which has improved dimensional stability and integrity, and which is achieved with a small number of processing steps.

It is another object of the present invention to enable photo-sensitive materials to be useful as high temperature masks.

These and other objects of the present invention will become apparent to those skilled in the art from the following detailed description of the invention, the accompanying drawings, and the appended claims.

DETAILED DESCRIPTION OF THE INVENTION

Figure 1:
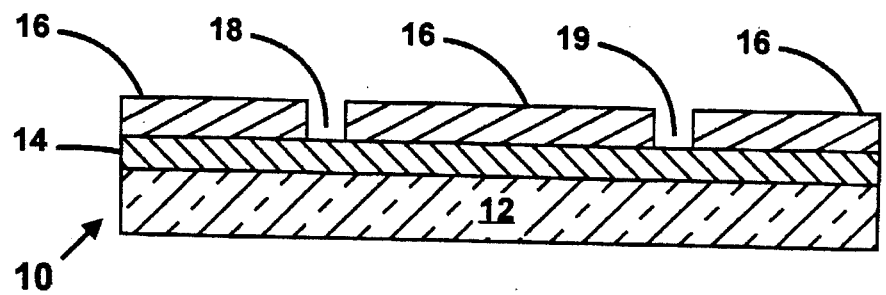
FIG. 1 shows a cross-sectional view of a patterned layer of photosensitive material which includes two minimum-sized vias, the left-most via being processed according to the present invention, and the right-most via being processed according to the prior art; the patterned photoresist layer overlies a material layer which is to be plasma-assisted etched through the vias.

FIG. 1 shows a cross-sectional view of a patterned layer 16 of photo-sensitive material which includes two minimum-sized vias 18 and 19. Photo-sensitive layer 16 is formed over a material layer 14, which in tun has been formed upon a substrate 12. Material layer 14 is to be subsequently etched with a plasma-assisted etching process using photo-sensitive layer 16 as an etch mask. In constructed embodiments of the present invention, photosensitive layer 16 comprises a positive photoresist material, which typically comprises a resin, a photo-active compound (PAC), and a solvent base. The photo-active compound, also called an activator, typically comprises diazo compounds, which contain nitrogen. The solvent base dissolves a resin and PAC, and is evaporated after the material has been coated on a wafer to form a layer thereon. The resin's polymer chains are normally insoluble in alkymer-aqueous solutions. Upon exposure to actinic radiation, the molecules of the photo-active compound (PAC) decompose into acidic products which, in the presence of an alkaline-aqueous solution, promote the dissolving of the polymer chains. The exposed portions of the positive-type photoresist then become soluble in an alkaline-aqueous solution.

In general, a positive-type photoresist has two to five times as much resin, by weight, than photo-active compound. When a positive photoresist is exposed and developed, the photo-active compound is dissolved away in the exposed portions. However, both the resin and the undecomposed PAC remain in the unexposed portions of the resist layer. The inventors have found that exposing the remaining PAC compound to high temperatures, as found in plasma-assisted etching procedures and the like, causes a significant portion of the PAC to decompose in a manner which releases gasses, which are believed to be predominantly nitrogen gas ($N_2$). The released gasses cause blistering in layer 16 during the plasma etching, which distorts and ruins the dimensional integrity of vias and mask features in layer 16, and can sometimes create spurious vias by bubbling underneath the surface of layer 16 and then breaking through the surface of layer 16. The bubbling and blistering are generally seen in thick photoresist layers, generally greater than 12 μm in thickness, at temperatures of 100° C. and above. The inventors also have observed that portions of photoresist layer 16 creep and flow when exposed to high temperatures, which also degrades the dimensional integrity of the mask pattern in layer 16.

Figure 2:
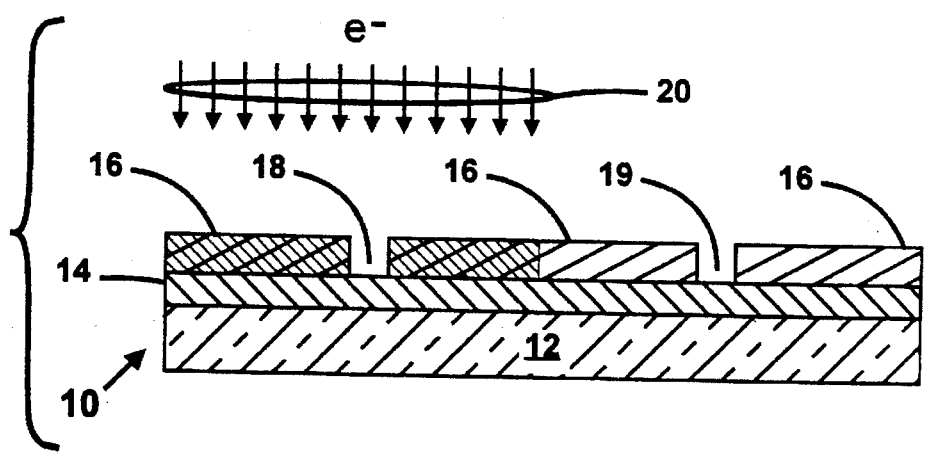
FIG. 2 shows a cross-sectional view of the patterned photosensitive layer where the left-most side, including the left-most via, is exposed to electron-beam radiation according to the present invention.

The inventors have discovered that by treating the patterned photo-sensitive material with electron-beam radiation under vacuum pressure prior to the plasma etching procedure, blistering is significantly reduced and dimensional integrity is maintained. FIG. 2 shows a cross-sectional view of photo-sensitive layer 16 where the left side and the left-most via 18 are exposed to an electron-beam radiation treatment according to the present invention, as more fully described below. For the purposes of comparing the beneficial results of the treatment, the right-hand side and right-most via 19 are not exposed to electron-beam radiation.

In accordance with the treatment methods of the present invention, a mask layer is first exposed to an electron-beam having an energy level of less than 12 KeV, and generally between 6 KeV and 12 KeV, and a current density of less than 2 μA/cm². The current density is preferably between 0.5 μA/cm² and 1.5 μA/cm², and the electron-beam exposure is performed under a vacuum pressure, preferably below 30 milliTorr. The energy of the electron beam is then increased over a first period of time to a second energy level at an average rate of not more than 0.3 KeV per second, and preferably at an average rate of between 0.1 KeV per second and 0.3 KeV per second. The time period is proportional to the thickness of the mask layer, having a value of at least 4 seconds for each micron of thickness of the mask layer (e.g., 40 seconds for a 10 μm thick mask). The energy may be increased continuously, or in finite steps, such as in the range of, for example, 2 KeV to 6 KeV per step. The second energy level is determined by the thickness of the mask layer, and is sufficiently high to enable electrons to penetrate to the bottom of the mask layer. The second energy level may be determined by the well-known Grun formula, which relates electron penetration depth to electron energy:

$$Rg = \frac{0.046}{d} V_A^{7/4}$$

When Rg is the Grim range (depth of electron penetration) in units of μm, d is the density of the mask material in units of g/cm³, and $V_A$ electron energy (accelerating voltage) in units of KeV. For typical photoresist and polymeric photosensitive materials, the density d ranges between 1.1 g/cm³ to 1.3 g/cm³. The second energy level provides a corresponding Grun range which is substantially equal to or greater than the thickness of the mask layer. Applying the above equation, the second energy level may be chosen as:

$$\text{second energy level} \geq \left[ \frac{(d)(\text{Mask Thickness})}{(0.046)} \right]^{4/7}$$

During the time period when the beam's energy is being increased to the second energy level, the beam's current density is kept below a limit level of 2 μA/cm², and preferably to a level of between 0.5 μA/cm² and 1.5 μA/cm². Once the second energy level is reached, the current density is increased from the first level to a second level above the limit level, and preferably between 4 μA/cm² and 16 μA/cm². The current density is preferably increased over a time duration that is roughly equal to the time duration over which the beam energy is increased, preferably at least 4 seconds per micron of mask thickness. The exposure continues until the mask layer receives an accumulated dosage of at least 50 μC/cm² for each micron of mask-layer thickness, and preferably an accumulated dosage of between 50 μC/cm² and 200 μC/cm² for each micron. This accumulated dosage is generally sufficient to partially cross-link the polymeric mask material to the point that good dimensional stability under high temperature processing conditions is achieved, but not so far that the material cannot be removed by a liquid stripper solution. The accumulated dosage preferably does not exceed 400 µC/cm$^2$ for each micron of thickness, at which point substantially all the material is cross-linked and generally cannot be removed by conventional liquid stripper solutions. However, a fully cross-linked polymeric material may be removed by other means, such as oxygen-plasma ashing, if the other means are compatible with other layers on the substrate and with the overall processing of the substrate.

The above preferred limits on the accumulated dosage have been found to be best for thick-film positive-type photoresist materials, and may not be optimal for other polymeric photo-sensitive materials. Nonetheless, it is well within the ordinary skill in the art to find optimal dosage limits of a given polymeric material by forming a plurality of test layers on separate test substrates, patterning the test layers with a common pattern, exposing each of the test layers to different amounts of accumulated dosage, and then determining the dimensional integrity of the patterned layers under test heating conditions, and determining the solubility of the test layers in the stripping solution As an example, a 16 µm thick photoresist layer of AZ4620® positive resist, manufactured by the Hoechst Corporation, is formed over a 150 mm wafer and patterned (see layer 16 shown FIG. 1). The photoresist layer is then soft baked at 90° C. for 2 hours to remove solvent from the photoresist layer. The substrate with the mask layer is placed in an ELECTROCURE 30 electron-beam curing system, manufactured by the Electron Vision Corporation. This system can apply a substantially uniform electron beam over a 6 inch (152 mm) diameter circular area. The system is pumped down to a vacuum of under 30 milliTorr, and an initial electron-beam having an energy of 12 KeV and a current of 0.2 mA is applied (corresponding to a current density of 1.1 µA/cm$^2$) for 25 seconds (left half of FIG. 2). The beam energy is then increased in steps of 5 KeV to a final value of 32 KeV (i.e., 17 KeV, 22 KeV, 27 KeV, and 32 KeV), each step being applied for 25 seconds. Thereafter, the current density is increased from 0.2 mA to 2 mA (corresponding to a current density of 11 µA/cm$^2$) over a time duration of 120 seconds, at a substantially constant rate of 0.15 µA/second. The electron-beam energy and current are then maintained for approximately 85 seconds, to provide a total accumulated dose of approximately 1,800 µC/cm$^2$.

With the above treatment procedure, the inventors have found that blistering of the photoresist mask layer during subsequent high temperature operations is substantially reduced. The inventors have also found that the creep and flow of the photoresist material which normally happens during high temperature procedures is significantly reduced with the electron-beam treatment.

Without limiting the invention to any particular theoretical explanation, it is believed that the initial low-current density electron-beam treatment breaks portions of the nitrogen atoms from the photo-active compound, which then diffuse to the photoresist surface and are collected under vacuum pressure. It is also believed that the initial low-current density electron-beam treatment causes a substantial portion of any remaining nitrogen atoms in the photo-active compound to change their bonding structure within the compound, and/or to form new bonds with atoms of the polymer resins, such that the nitrogen atoms do not combine in pairs to form nitrogen gas upon subsequent heating. It is further theorized that the gradual increase in the electron-beam energy draws out the nitrogen gas molecules in a gradual and controlled manner which prevents a sudden gas accumulation within the layer, which in turn could cause blistering during the electron-beam treatment. It is believed that the low current level during the initial time period is sufficient to deactivate the nitrogen, but is not high enough to cause substantial cross-linking of the photoresist resin during the initial time period, which would tend to trap any evolving gases. It is further believed that the further treatment at full beam energy and increased current level acts to cross-link the photoresist resin, and that the cross-linking reduces creep and flow in the photoresist material in subsequent high temperature operations.

Figure 3:
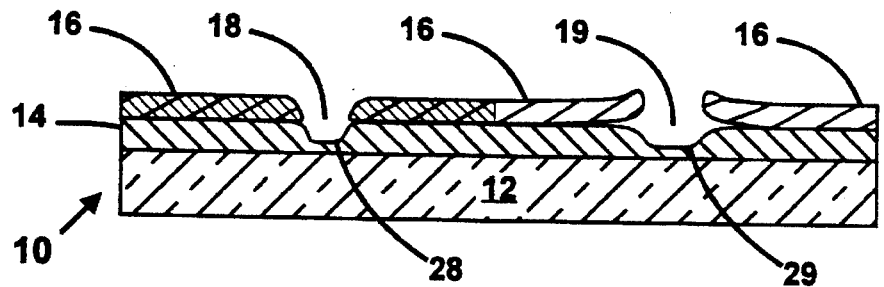
FIG. 3 shows a cross-sectional view of both the electron-beam treated via and the untreated via during a high-temperature plasma etching procedure where the underlying material layer is plasma-etched with the pattern of the photosensitive material; the procedure forms corresponding left-most and right-most vias in the underlying material layer.

To show the beneficial results of the treatment according to the present invention, FIG. 2 shows a cross-sectional view of photo-sensitive layer 16 where the left side and the left-most via 18 are exposed to an electron-beam radiation treatment according to the present invention, and where the right side and left-most via 19 have not been. Both sides have been soft baked under the same conditions. Layers 14 and 16 are then exposed to a plasma-assisted etching procedure which generates heat and temperature at the exposed surfaces of these layers. FIG. 3 shows a cross-sectional view of both the electron-beam treated via 18 and the untreated via 19 at a point which is about two-thirds of the way through the etching procedure. The etching procedure etches both layers 14 and 16, with layer 14 typically and preferably being etched at a higher rate than mask layer 16. (However, there are some useful instances where layer 14 is etched at a faster rate than layer 16.) As shown in FIG. 3, the treated portion of layer 16 substantially maintains the dimensional integrity of via 18, with the exception of a relatively small amount of lateral etching. In comparison, the untreated portion of layer 16 has partially separated from the underlying layer 14 in the location of via 19. The separation is caused by out-gassing of gasses derived from heating of the photo-active compound. The photoresist at the edges of via 19 has also crept and flowed away, thereby creating a larger exposure aperture.

The separation of layer 14 at via 19 is one of many possible failure mechanisms for the untreated layer, and FIG. 3 does not show all failure possibilities. Another common failure mechanism is that the untreated layer 14 flows into via 19 and narrows the aperture, and sometimes completely fills via 19. This failure results in the narrowing of the dimensions of the intended structure. As another failure mechanism, the untreated layer 14 may burst open at a location away from via 19 due to the formation of a trapped gas bubble, creating an unintended via to be etched in the underlying layer 16.

Figure 4:
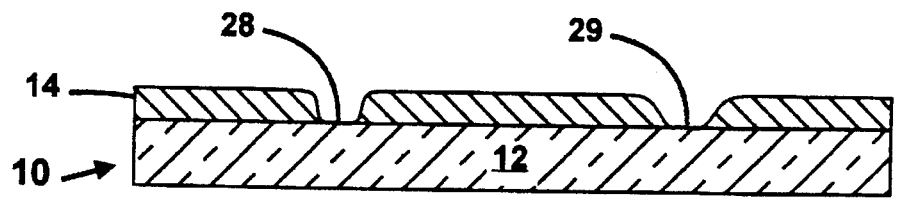
FIG. 4 shows a cross-sectional view of the underlying layer after the plasma etch procedure and after the remainder of the photosensitive material has been removed.

During the plasma etching process, corresponding vias 28 and 29 are formed in layer 14 underneath vias 18 and 19. Because of the separation and creepage in the untreated photoresist at via 19, the corresponding via 29 in layer 14 is substantially wider than via 28 underneath via 18. FIG. 4 shows a cross-sectional view of layer 14 after the plasma etching procedure and after the remainder of layer 16 is removed. At the bottom of layer 14, via 29 has a slightly larger aperture within via 28. At the top of layer 14, however, via 29 has a substantially larger width than via 28. Accordingly, the treatment of mask layer 16 with electron-beam exposure substantially increases its resolution capability. Moreover, via 28 has a substantially larger aspect ratio (height-to-width) than via 29. In many applications, particularly where material is electroplated into vias to form posts for interconnects, high aspect ratios are important.

Layer 16 can be removed by a liquid stripper or by oxygen plasma ashing. If a liquid stripper is used, the electron dosage should not exceed that required to modify the photo-active compound, otherwise the stripping procedure will have poor results.

The treatment according to the present invention improves uniformity and repeatability of etch processes and the like and of other high temperature procedures (such as ion implantation) by preventing the resist from flowing during the high temperature procedure. Without limiting the invention to any particular theoretical explanation or model, it is believed that the improved flow stability of the treated photoresist is due to a partial cross-linking of the resin's polymer chains in the photoresist material. Moreover, defects induced by gas bubbles bursting the skin of a layer (thereby creating an unintended via) are reduced and, in many cases, eliminated. The procedure may be used with all types of plasma sources and at all frequencies of plasma excitation.

Although the present invention has been demonstrated with positive-type photo resists, the present invention may also be applied to negative photoresists. Many negative photoresists include photo-initiator compounds (e.g., azide compounds), which often contain nitrogen. Additionally, many positive-type image reversal photoresists may also be used in the present invention. The treatment methods according to the present invention can also be applied to non-photo-sensitive polymer materials which have been patterned by other means.

While the present invention has been exemplified by a high temperature process comprising plasma-assisted etching, the treatment according to the present invention is useful for any process which raises the temperature of the resist material. Exemplary processes include, but are not limited to, hot wet-chemical etching, ion implantation, and electroplating. In hot wet etching, the bulk temperature of the bath may be between 50° C. and 75° C., but the local temperature at resist surface may be well over 100° C. if the etching reaction is exothermic, as is typically the case. In ion implantation, the bulk temperature can be as high as between 50° C. and 200° C., depending on the dose rate, and is typically high at the resist surface where the energy of the ions is being absorbed.

In place of the electron-beam exposure, the inventors have tried deep ultraviolet exposure and CF4-plasma treatment, and found that these other processes did not achieve comparable results. In both the deep UV exposure and CF4-plasma treatment, the photoresist's surface reticulates at elevated temperature due to solvent evolution. Specifically, the top hundred angstroms or so of the photoresist layer become very hot during the deep UV and CF4-plasma treatments, and become relatively hard in comparison to the underlying photoresist. When the underlying photoresist is thereafter exposed to the plasma etching procedure, the heating action thereof causes gasses to out-gas from the underlying portion of the photoresist. In effect, the top 100 angstroms of the photoresists act as a vapor barrier, trapping the gas and causing ragged edges in the etched features (i.e., reticulation).

While the present invention has been particularly described with respect to the illustrated embodiment, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of treating a patterned mask layer comprising the steps of:

(a) exposing the mask layer to electron-beam radiation having a first energy level and a first current density level, said first current density being below a limit level;

(b) increasing the energy level of said electron-beam radiation from said first energy level to a second energy level over a first time period while maintaining the current density level below said limit level; and (c) thereafter increasing the current density from the first current density level to a second current density level above said limit level.

2. The method of claim 1 wherein said first current density level is less than 2 $\mu C/cm^2$ per second.

3. The method of claim 1 wherein said first current density level is between 0.5 $\mu C/cm^2$ per second and 1.5 $\mu C/cm^2$ per second.

4. The method of claim 1 wherein said limit level is less than 2 $\mu C/cm^2$ per second.

5. The method of claim 1 wherein said second current density level is between 6 $\mu C/cm^2$ per second and 16 $\mu C/cm^2$ per second.

6. The method of claim 1 wherein said first time period in step (b) is dependent upon the thickness of the mask layer, having a value of at least 4 seconds for each micron of thickness.

7. The method of claim 1 wherein the beam's energy level in step (b) is increased from said first energy level to said second energy level at an average rate of not more than 0.3 KeV per second over said first time period.

8. The method of claim 1 wherein the beams energy level in step (b) is increased from said first energy level to said second energy level at an average rate of between 0.1 KeV per second and 0.3 KeV per second over said first time period.

9. The method of claim 1 wherein said second energy level has a corresponding Grun range which is substantially equal to or greater than the thickness of the mask layer.

10. The method of claim 1 wherein the electron-beam radiation exposure has, for each micron of mask-layer thickness, an accumulated dosage of at least 50 $\mu C/cm^2$.

* * * * *

UNITED STATES PATENT AND TRADEMARK OFFICE
CERTIFICATE OF CORRECTION

PATENT NO. : 5,660,957
DATED : August 26, 1997
INVENTOR(S) : William T. Chou, *et al.*

It is certified that error appears in the above-identified patent and that said Letters Patent is hereby corrected as shown below:

Column 3, line 27, please delete "tun" and insert therefor --turn--.

Column 3, line 41, there should not be a paragraph break.

Column 4, line 63, please delete "4seconds" and insert therefor --4 seconds--.

Column 5, line 25, after "solution" please insert --.--

Signed and Sealed this

Thirty-first Day of March, 1998

*Attest:*

BRUCE LEHMAN

*Attesting Officer*  *Commissioner of Patents and Trademarks*